US012632628B2

(12) United States Patent
Jing et al.

(10) Patent No.: US 12,632,628 B2
(45) Date of Patent: May 19, 2026

(54) VERIFICATION SYSTEM, VERIFICATION METHOD, ELECTRONIC DEVICE, AND STORAGE MEDIUM

(71) Applicants: Beijing Youzhuju Network Technology Co., Ltd., Beijing (CN); Lemon Inc., Grand Cayman (KY)

(72) Inventors: Xiaolin Jing, Beijing (CN); Di Zhang, Beijing (CN); Robin Sik, Los Angeles, CA (US); Shan Lu, Los Angeles, CA (US); Jian Wang, Beijing (CN)

(73) Assignees: Beijing Youzhuju Network Technology Co., Ltd., Beijing (CN); Lemon Inc., Grand Cayman (KY)

( * ) Notice: Subject to any disclaimer, the term of this patent is extended or adjusted under 35 U.S.C. 154(b) by 0 days.

(21) Appl. No.: 19/063,259

(22) Filed: Feb. 25, 2025

(65) Prior Publication Data

US 2025/0200259 A1      Jun. 19, 2025

Related U.S. Application Data

(63) Continuation of application No. PCT/CN2023/115777, filed on Aug. 30, 2023.

(30) Foreign Application Priority Data

Aug. 31, 2022      (CN) ......................... 202211062729.2

(51) Int. Cl.
*G06F 30/33* (2020.01)

(52) U.S. Cl.
CPC .................................... *G06F 30/33* (2020.01)

(58) Field of Classification Search
CPC .. G06F 30/33; G06F 30/3308; G06F 30/3315; G06F 2111/00; G06F 2119/22
See application file for complete search history.

(56) References Cited

U.S. PATENT DOCUMENTS 6,182,258 B1 * 1/2001 Hollander ............. G06F 11/261
714/739
6,571,373 B1 * 5/2003 Devins ........... G01R 31/318357
716/137
(Continued)

FOREIGN PATENT DOCUMENTS

CN      104657245 A      5/2015
CN      112131147 A      12/2020
(Continued)

OTHER PUBLICATIONS

International Patent Application No. PCT/CN2023/115777; Int'l Written Opinion and Search Report; dated Oct. 30, 2023; 6 pages.
(Continued)

*Primary Examiner* — Kibrom K Gebresilassie
(74) *Attorney, Agent, or Firm* — BakerHostetler

(57) ABSTRACT

The present disclosure provides a verification system, a verification method, an electronic device and a storage medium. The verification system includes a simulation verification device, a first portion and a second portion. The first portion includes a first master module and a second slave module. The second slave module includes a memory unit connected to a memory access interface at a periphery of a design under test. The second portion includes a first direct programming interface, a second direct programming interface, a function library module, and a test case module. The first direct programming interface communicates with the first master module and is configured to call a first function to implement front door access to a register of the design under test. The second direct programming interface communicates with the memory unit and is configured to call a second function to implement back door access to the memory unit.

20 Claims, 7 Drawing Sheets

(56) References Cited

U.S. PATENT DOCUMENTS

| | | | | |
|---|---|---|---|---|
| 11,392,533 | B1 * | 7/2022 | Guo | G06F 13/4282 |
| 2007/0050758 | A1 * | 3/2007 | Arevalo | G06F 30/331 |
| | | | | 702/108 |
| 2008/0163143 | A1 * | 7/2008 | Kwon | G06F 30/33 |
| | | | | 716/138 |
| 2009/0164861 | A1 * | 6/2009 | Tseng | G06F 11/263 |
| | | | | 714/724 |

FOREIGN PATENT DOCUMENTS

| | | |
|---|---|---|
| CN | 112131829 A | 12/2020 |
| CN | 113505066 A | 10/2021 |
| CN | 113657069 A | 11/2021 |
| CN | 114330177 A | 4/2022 |
| JP | 2007-004832 A | 1/2007 |
| WO | WO 2005/008495 A2 | 1/2005 |
| WO | WO 2020/152231 A1 | 7/2020 |

OTHER PUBLICATIONS

Japan Patent Application No. 2025-512958; Notice of Reason for Refusal; dated Jul. 22, 2025; 4 pages.

European Patent Application No. 23859391.7; Extended Search Report; dated Sep. 18, 2025; 13 pages.

"Accelerated VIP"; https://web.archive.org/web/20220811055646/https://www.cadence.com/en_US/home/tools/system-design-and-verification/verification-ip/accelerated-vip.html#arm-amba; Cadence; accessed Dec. 1, 2025; 5 pages.

"Amba Vip Solutions"; https://www.cadence.com/en_US/home/tools/system-design-and-verification/verification-i itml; Cadence; accessed Dec. 1, 2025; 6 pages.

"Cadence Palladium Z1 Enterprise Emulation Platform"; https://www.cadence.com/content/dam/cadence-www/global/en_US/documents/tools/system-design-verification/palladium-z1-ds.pdf; Cadence Design Systems; @2015; accessed Dec. 1, 2025; 7 pages.

El-Ashry et al.; "Efficient Methodology of Sampling UVM RAL during Simulation for SoC Functional Coverage"; 19th Int'l Workshop on Microprocessor and SOC Test, Security and Verification (MTV); 2018; p. 61-66.

IEEE Standard for Universal Verification Methodology Language Reference Manual; IEEE Sa Standards Association; Jun. 2020; 117 pages.

China Patent Application No. 202211062729.2; Office Action; dated Nov. 27, 2025; 39 pages.

China Patent Application No. 202211062729.2; Registration Procedure; dated Feb. 11, 2026; 8 pages.

* cited by examiner

| Address space 0 | Address range | Size | Main functions |
|---|---|---|---|
| First master module | 0x0000_0000~0x000F_FFFF | 1MB | Configuring a register of the module under test |
| | 0x0010_0000~0x001F_FFFF | 1MB | Generating a reset signal |
| Address space 1 | Address range | Size | |
| Second slave module 0 | 0x8000_0000~0xFFFF_FFFF | 2GB | |
| Address space 2 | Address range | Size | |
| Second slave module 1 | 0x4000_0000~0x7FFF_FFFF | 1GB | |

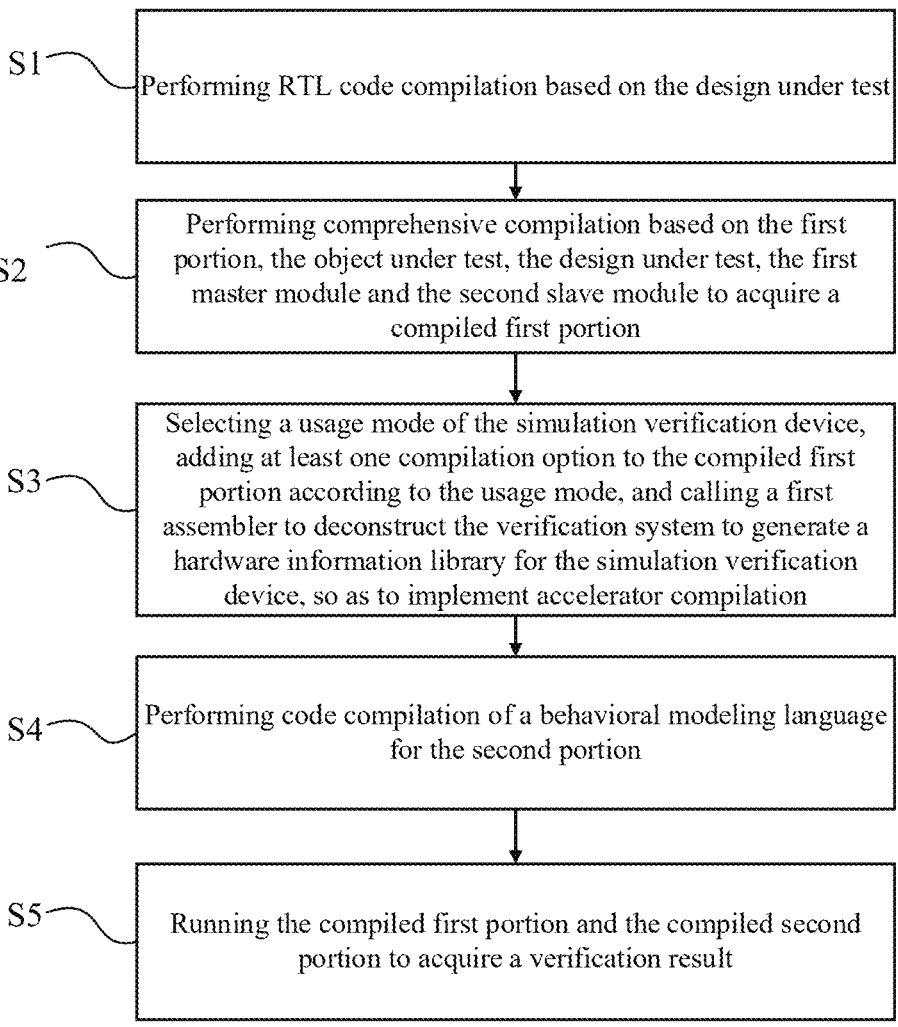

S1 — Performing RTL code compilation based on the design under test

S2 — Performing comprehensive compilation based on the first portion, the object under test, the design under test, the first master module and the second slave module to acquire a compiled first portion S3 — Selecting a usage mode of the simulation verification device, adding at least one compilation option to the compiled first portion according to the usage mode, and calling a first assembler to deconstruct the verification system to generate a hardware information library for the simulation verification device, so as to implement accelerator compilation S4 — Performing code compilation of a behavioral modeling language for the second portion S5 — Running the compiled first portion and the compiled second portion to acquire a verification result

Fig. 5

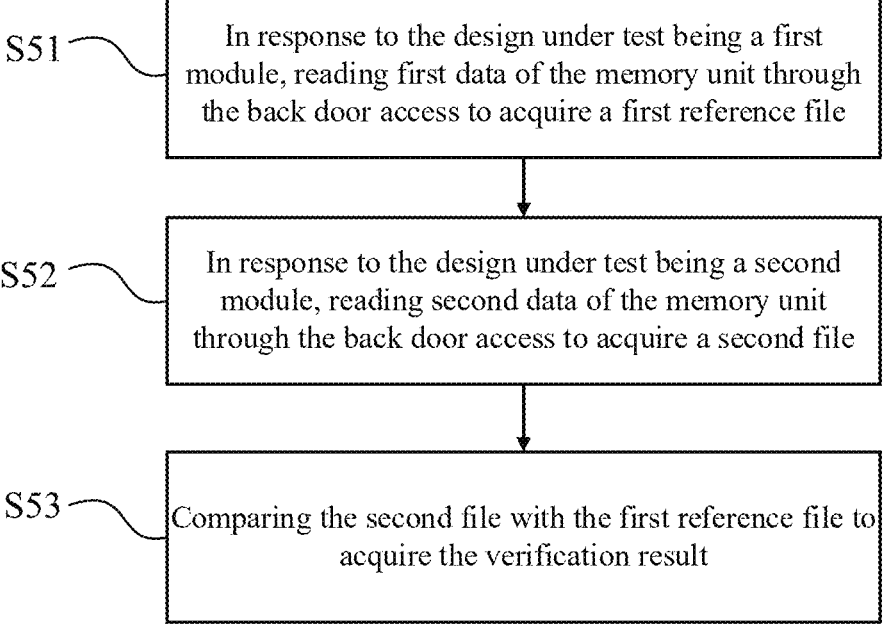

S51 — In response to the design under test being a first module, reading first data of the memory unit through the back door access to acquire a first reference file S52 — In response to the design under test being a second module, reading second data of the memory unit through the back door access to acquire a second file S53 — Comparing the second file with the first reference file to acquire the verification result

Fig. 6

VERIFICATION SYSTEM, VERIFICATION METHOD, ELECTRONIC DEVICE, AND STORAGE MEDIUM

CROSS-REFERENCE TO RELATED APPLICATION

This application is a continuation of International Patent Application No. PCT/CN2023/115777, filed on Aug. 30, 2023, which claims the priority to and benefits of the Chinese Patent Application, No. 202211062729.2, which was filed on Aug. 31, 2022. All the aforementioned patent applications are hereby incorporated by reference in their entireties.

TECHNICAL FIELD

Embodiments of the present disclosure relate to a verification system, a verification method, an electronic device and a storage medium.

BACKGROUND

At present, with the rapid development of electronic information industry, the scale of system-on-chip (SoC) becomes larger and larger, the chip verification work, which accounts for nearly 70% of the whole chip development workload on average, becomes more and more complex, and the requirements for chip risk control become higher and higher.

The integrated circuit hardware models associated with very large-scale integration (VLSI) integrated circuit chips have become very complex, and the corresponding design and verification calculations have also greatly increased. Therefore, for more complex functional test scenarios, it has been difficult for the speed, capacity and efficiency of electronic design automation (EDA) simulation to meet the needs of SoC verification, and hardware accelerated verification technology should be developed.

The hardware accelerated verification technology verifies a chip design by a hardware emulator that maps a design under test (DUT) to a processor array or field programmable gate array (FPGA) and then verifies a mapped equivalent system.

Compared with software simulation, the speed of hardware accelerated verification is improved. An average speed of the software simulation is, for example, 1 KHz, while an average speed of the hardware accelerated simulation verification method, for example, 2 MHz, which greatly improves the verification efficiency.

SUMMARY

At least one embodiment of the present disclosure provides a verification system, which includes a simulation verification device, and a first portion and a second portion which are created on the simulation verification device respectively. The first portion includes a first master module and at least one second slave module which are connected to an object under test. The object under test includes a design under test and a plurality of object interfaces connected to a periphery of the module under test, the plurality of object interfaces include a memory access interface, the second slave module includes a memory unit, and the memory unit is connected to the memory access interface. The second portion includes a first direct programming interface, a second direct programming interface, a function library module and a test case module, and the test case module is configured to provide at least one test case. The first direct programming interface communicates with the first master module, and the first direct programming interface is configured to: in response to running the test case, call at least one first function in the function library module to implement front door access to a register of the module under test. The second direct programming interface communicates with the memory unit of the first portion, and the second direct programming interface is configured to: in response to running the test case, call at least one second function in the function library module to implement back door access to the memory unit.

At least one embodiment of the present disclosure also provides a verification method based on the verification system as described above, and the verification method includes: performing register transfer level code compilation based on the design under test; performing comprehensive compilation based on the first portion, the object under test, the design under test, the first master module and the second slave module to acquire a compiled first portion; selecting a usage mode of the simulation verification device, adding the compiled first portion to at least one compilation option according to the usage mode, and calling a first assembler to deconstruct the verification system to generate a hardware information library for the simulation verification device, so as to implement accelerator compilation; performing code compilation of a behavioral modeling language for the second portion; and running the compiled first portion and the compiled second portion to acquire a verification result.

At least one embodiment of the present disclosure provides an electronic device, including a processor and a memory; wherein a computer program is stored on the memory, and when the computer program is executed by the processor, the verification method described in any one of the above is implemented.

At least one embodiment of the present disclosure provides a computer-readable storage medium, storing a computer program, wherein the computer program, when executed by a processing module, implements the verification method described in any one of the above.

BRIEF DESCRIPTION OF DRAWINGS

In order to more clearly illustrate the technical solutions of the embodiments of the present disclosure or the prior art, the drawings necessary for description of the embodiments or the prior art will be briefly described in the following; it is obvious that the described drawings as below are only related to some embodiments of the present disclosure, from which other drawings can be obtained for those ordinary skilled in the art without creative labors.

FIG. 5 is a flowchart of a verification method provided by some embodiments of the present disclosure;

FIG. 6 is a flowchart of an execution process of step S5 of the verification method in FIG. 5;

DETAILED DESCRIPTION

Figure 1:
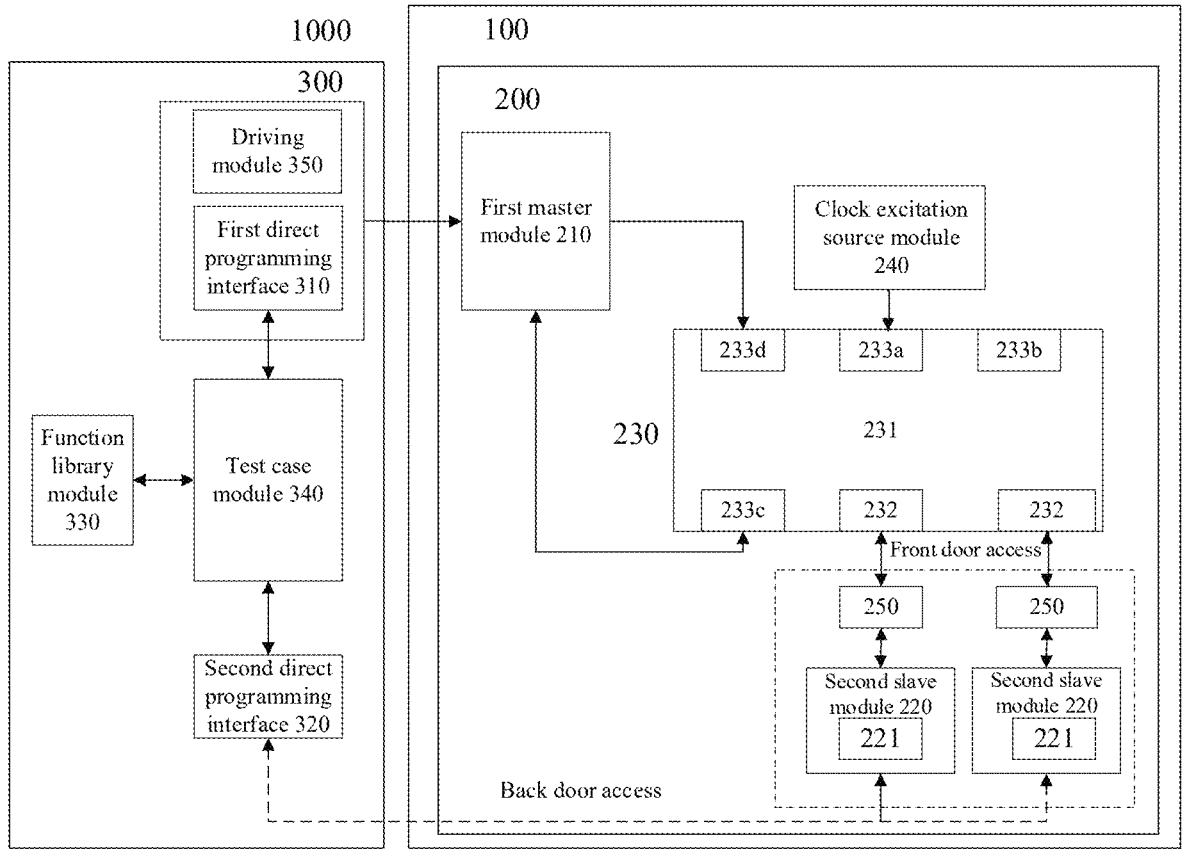
FIG. 1 is a schematic block diagram of a verification system provided by some embodiments of the present disclosure.

Hereinafter, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments herein, all other embodiment(s) that can be obtained by those ordinary skilled in the art without any inventive work should be fallen within the scope of protection of the present disclosure.

Unless otherwise defined, all terms (including technical terms and scientific terms) used in the embodiments of the present disclosure have the same meanings as commonly understood by one of ordinary skilled in the art to which the present disclosure belongs. It should also be understood that terms such as those defined in a general dictionary should be interpreted to have meanings consistent with their meanings in the context of the relevant art, and are not to be interpreted in an idealized or overly formal sense, unless an embodiment of the present disclosure is explicitly defined so.

As used in the embodiments of the present disclosure, words such as "first", "second" and similarities do not indicate any order, quantity, or importance, but rather are used to distinguish between different components. Similar words such as "a", "an" or "the" do not indicate a limitation of quantity, but rather indicate the presence of at least one. Similarly, the use of the terms "comprising/including" or "comprise/include" and the like, is intended to mean that an element or article appearing before the word covers the listed element or article appearing after the word and its equivalents, but does not exclude other elements or articles. Similar terms such as "connect" or "connected" are not limited to physical or mechanical connections, but may include electrical or communicative connections, regardless of whether it's direct or indirect.

Flowcharts are used in the embodiments of the present disclosure to illustrate steps of a method in accordance with the embodiments of the present disclosure. It should be understood that the preceding or following steps are not necessarily performed precisely in order. Rather, various steps may be carried out in reverse order or concurrently. Other operations can be added to these processes, or one or more steps are removed from these processes.

Studies of the present disclosure have found that a hardware simulation accelerated verification platform includes an FPGA-based verification platform, and the FPGA-based verification platform includes HAPS or ZEBU, etc. However, due to restrictions by characteristics such as capacity limitations, long synthesis time, difficult debugging, a requirement for manual dividing of large systems and the need to modify clock trees, the FPGA-based verification platform is not suitable for functional simulation acceleration as a substitute for EDA simulation.

Studies of the present disclosure have also found that some of the current solutions for simulation acceleration have the following disadvantages:

Firstly, the simulation acceleration based on universal verification methodology (UVM) can reuse an original UVM environment and test cases when simulation acceleration is performed, but a shell analysis of UVM related methodology is relatively complex and the acceleration performance is low, and the migration of UVM to a comprehensive simulation acceleration verification platform requires a lot of optimization work, which is time-consuming and labor-intensive.

Secondly, the simulation acceleration based on embedded interface is fast, but the test platform needs to be written in an integrated form and integrated into a simulation accelerator. The reusability is very low. When different test platforms are combined with the simulation accelerator, it is necessary to rewrite, parse and debug, and the workload is large.

At least an embodiment of the present disclosure provides a verification system including a simulation verification device, and a first portion and a second portion which are created on the simulation verification device respectively. The first portion includes a first master module and at least one second slave module which are connected to an object under test. The object under test includes a design under test and a plurality of object interfaces connected to a periphery of the module under test, the plurality of object interfaces include a memory access interface, the second slave module includes a memory unit, and the memory unit is connected to the memory access interface. The second portion includes a first direct programming interface, a second direct programming interface, a function library module and a test case module, and the test case module is configured to provide at least one test case. The first direct programming interface communicates with the first master module, and the first direct programming interface is configured to: in response to running the test case, call at least one first function in the function library module to implement front door access to a register of the module under test. The second direct programming interface communicates with the memory unit of the first portion, and the second direct programming interface is configured to: in response to running the test case, call at least one second function in the function library module to implement back door access to the memory unit.

By providing the first direct programming interface and the second direct programming interface, the verification system of the above-mentioned embodiment of the present disclosure can achieve the synchronization between a software side of the verification system and a hardware side of the verification system, facilitate the operations such as register reading and writing, memory accessing of the memory unit and so on in function verification of the design under test, consume less simulation time, improve chip verification efficiency, and can achieve reusable verification at system level of a chip and/or module level of a chip, with a wide application prospect.

Figure 2:
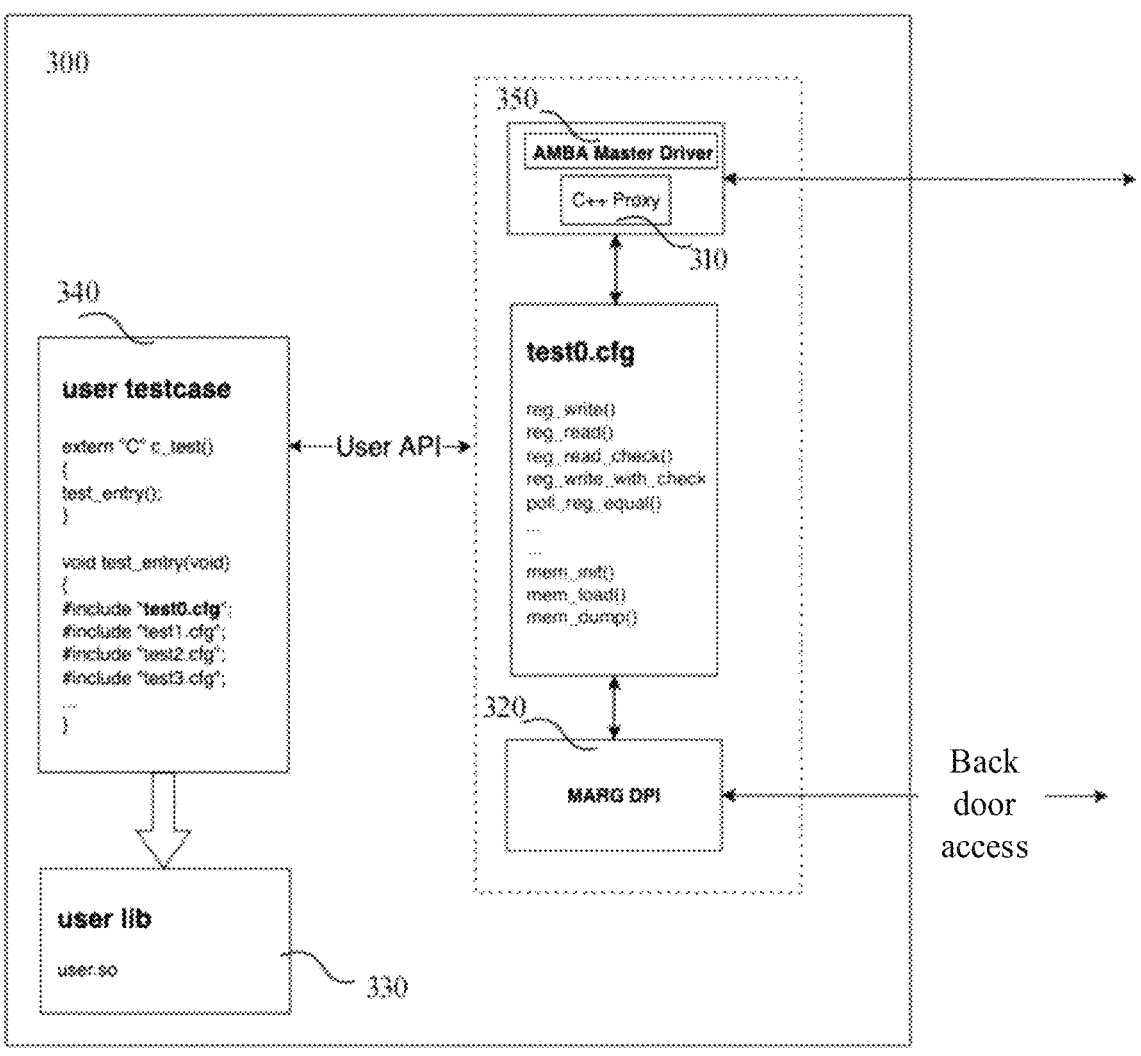
FIG. 2 is a schematic block diagram of a software side of a verification system provided by some embodiments of the present disclosure.

FIG. 1 is a schematic block diagram of a verification system provided by some embodiments of the present disclosure. FIG. 2 is a schematic block diagram of the verification system at a software side provided by some embodiments of the present disclosure.

For example, as shown in FIG. 1, the verification system 1000 includes a simulation verification device 100, and a first portion 200 and a second portion 300 which are created on the simulation verification device 100 respectively. For example, the first portion 200 is a hardware side and the hardware side is configured to be created based on a hardware description language (HDL). The second portion 300 is a software side and the software side is configured to be created based on a behavioral modeling language. For example, hardware description languages include Verilog, System Verilog, etc. and behavioral modeling languages include C language or CPP language (also referred to as C++ language), etc.

For example, as shown in FIG. 1, the first portion 200 includes a first master module 210 and at least one second slave module 220 which are connected to an object under test 230 respectively. The object under test 230 includes a design under test 231 and a plurality of object interfaces connected to a periphery of the design under test 231. The plurality of object interfaces includes at least one memory access interface 232. The second slave module 220 includes a memory unit 221, which is connected to the memory access interface 232.

For example, the design under test 231 is also called DUT, for example, the DUT is implemented by register transfer level (RTL) design code.

For example, as shown in FIG. 1, the second portion 300 includes a first direct programming interface 310, a second direct programming interface 320, a function library module 330 and a test case module 340. The test case module 340 is configured to provide at least one test case.

For example, each of the first direct programming interface 310 and/or the second direct programming interface 320 is a direct programming interface (DPI), which is an interface for calling each other between a hardware description language (e.g. System Verilog) and a programming language for software (e.g. C/C++).

For example, the function library module 330 is configured to be a function library formed based on a plurality of functions for use by other programs. For example, the library module 330 may select a static library. An interior of the function library module 330 includes at least one first function and at least one second function. The first function, when called for use, can realize the configuration of the register, and the second function, when called for use, can realize the access to the memory unit.

For example, as shown in FIG. 1, the first direct programming interface 310 communicates with the first master module 210, and the first direct programming interface 310 is configured to; in response to running the test case originating from the test case module 340, call at least one first function in the function library module 330 to implement front door access to a register of the design under test 231. For example, the front door access includes a front door reading data operation and/or a front door writing data operation, and correspondingly, the first function includes a function related to register reading and/or writing.

For example, as shown in FIG. 1, the second direct programming interface 320 communicates with the memory unit 221 of the first portion 200, and the second direct programming interface 320 is configured to: in response to running the test case originating from the test case module 340, call at least one second function in the function library module 330 to implement back door access of the memory unit 221. For example, the back door access includes a back door data loading operation and/or a back door data exporting operation, and correspondingly, the second function includes a memory unit loading and/or exporting function.

In some examples, "front door access" of embodiments of the present disclosure refers to read-write access to actual values of the register of DUT following bus timing in response to simulating a central processing unit (CPU) to issue read and write instructions on the bus through a register configuration bus (e.g. AMBA protocol). The front door access involves real RTL transfers and relies on the bus timing protocol for transfers, and thus the front door access consumes simulation time. For example, the front door access may not be read and written according to domain.

In some examples, "back door access" of embodiments of the present disclosure refers to an access method that directly reads a two-dimensional array of the memory unit. The back door access does not consume simulation time. For example, the back door access may be read and written according to domain.

By providing the first direct programming interface and the second direct programming interface, the verification system of the above-mentioned embodiment of the present disclosure can achieve the synchronization between a software side and a hardware side of the verification system, facilitate the operations such as register reading and writing, memory unit accessing and so on in function verification of the design under test, consume less simulation time, improve chip verification efficiency, and can achieve reusable verification at system level of a chip and module level of a chip, with a wide application prospect.

In some examples, the object under test 230 of the first portion 200 is a top layer on the hardware side of the verification system 100, for example, the design under test 231 of the object under test 230 includes an intellectual property (IP) module of a SoC chip. For example, the design under test 231 may be a standalone IP in the SoC to be verified by the verification system 100. For example, the SoC may be based on a microarchitecture of instruction sets such as X86, ARM, RISC-V, etc., which is not limited by the embodiment of the present disclosure. The design under test 231 is universally applicable to key IPs in the chip, for example, the design under test 231 includes, but is not limited to, general purpose graphics processor unit (GPGPU), and embodiments of the present disclosure are not limited and described in detail herein. The verification system of the above-described embodiments of the present disclosure is applicable to the acceleration of simulation verification of IP level modules in SoC and the development of software bare metal, and the time required for simulation verification is greatly reduced.

It should also be noted that the design under test 231 of the embodiments of the present disclosure may belongs to the IP module level in some scenarios and may belong to the sub-system level in other scenarios, and the embodiments of the present disclosure are not limited thereto and this does not affect the protection scope of the present disclosure.

It should be noted that the first master module and the second slave module of the embodiments of the present disclosure are referred to as a master module or a slave module with respect to the object under test respectively, which is merely a way of naming and facilitating the clarity and conciseness of the description of the present disclosure, and the embodiments of the present disclosure are not limited thereto, and the protection scope of the embodiments of the present disclosure is not limited thereto.

In some examples, the simulation verification device 100 includes a first processor and the first processor includes a plurality of second processors connected in parallel, that is, the second processors are sub-processors with respect to the first processor.

For example, the simulation verification device includes a Palladium device of Cadence, and an underlying architecture of the Palladium device is a CPU processor and an application-specific integrated circuit. In the processors of the Palladium device, a large number of processors are connected in parallel, so that the acceleration of simulation verification is performed through parallel paths.

The embodiments of the present disclosure perform hardware simulation accelerated verification based on the simulation verification device such as the Palladium device, which enables the chip RTL to remain compatible with fewer modifications; and excellent debugging performance and high signal visibility are achieved, high platform compatibility is achieved to support System Verilog or System C or System CPP. Furthermore, the SoC design does not need to be divided manually, and too much additional manpower input is not needed, etc., so that the requirements for verification time and the quality of chip delivery in a chip project can be well met.

It should be noted that the simulation verification device used in the verification system of the embodiments of the present disclosure is not limited to only a Palladium device, but may also be other processor-based built simulation verification devices, and the embodiments of the present disclosure are not limited and described in unnecessary details.

In some examples, the second portion 300 is configured to be created based on C language or CPP language, for example, the second portion 300 is a software side running on Cadence, e.g. a compiled software Xcelium. In this way, the verification system according to an embodiment of the present disclosure can conveniently realize the execution of the relevant instructions after the C language code or CPP language code is compiled, which is widely used and convenient for the development work of developers.

In some examples, the first master module 210 is configured to generate read instructions and/or write instructions, configure the registers of the design under test 231 and generate a reset (such as a global reset). For example, as shown in FIGS. 1 and 2, the second portion 200 further includes a driving module 350 for driving the first master module 210 of the first portion 200, so that the first master module 210 configures the register of the design under test 231 and performs the global reset.

In some examples, the first master module 210 and the second slave module 220 are accelerated verification IPs (AVIP) designed for the simulation verification device 100 based on a verification IP (VIP).

For example, as shown in FIG. 2, the first master module 210 includes a master module with an advanced microcontroller bus architecture, which can also be called AMBA MASTER, that is, the first master module 210 supports the AMBA standard bus protocol. Accordingly, the driving module 350 may also be referred to as an AMBA MASTER Driver. For example, the second slave module 220 includes a slave module with an advanced microcontroller bus architecture, which can also be called AMBA SLAVE, that is, the second slave module 220 supports the AMBA standard bus protocol.

The verification system of the above-described embodiments of the present disclosure enables more extensive bus protocol verification at the module level and sub-system level by adopting an AVIP that can support multiple standard bus protocols.

For example, as shown in FIG. 1, the first portion 200 also includes a clock excitation source module 240 for providing a system clock signal on the hardware side for use by DUT or the like. For example, a clock frequency of a clock signal may be 1 GHZ. This is merely exemplary and is not a limitation of the present disclosure.

For example, as shown in FIG. 1, the plurality of object interfaces of the object under test 230 further includes at least one selected from the group consisting of a first interface 233a, a second interface 233b, a third interface 233c and a fourth interface 233d.

For example, as shown in FIG. 1, the first interface 233a is connected to the clock excitation source module 240 to receive the clock signal. The verification system of the present disclosure may be driven by a global clock, which facilitates synchronization of the function, performance and stability of a digital system.

For example, as shown in FIG. 1, the second interface 233b is configured to receive an interrupt request signal. For example, the interrupt request signal is used to stop a current operation state of the relevant hardware and switch to an operation task corresponding to the interrupt request signal, and then switch back after processing of the operation task is completed, so that signal collision can be avoided.

For example, as shown in FIG. 1, the first master module 210 is connected to the third interface 233c for configuring the register of the design under test 231. For example, as shown in FIG. 1, the first master module 210 is connected to the fourth interface 233d for resetting the first portion 200.

For example, in the example of FIG. 1, the quantity of memory access interfaces 232 is two, the quantity of second slave modules 220 is two, and each second slave module 220 includes one memory unit 221. In this way, the memory units 221 are in one-to-one correspondence with the memory access interfaces 232, so that a data transmission path between each memory unit 221 and the design under test 231 can be formed, so as to implement the front door access to the register. This is merely exemplary and is not a limitation of the present disclosure.

For example, as shown in FIG. 1, the memory unit 221 of the second slave module 220 is used for storing register data, that is, a main function of the second slave module 220 in the verification system 100 is as a memory of the verification system. For example, for implementing a front door write operation, embodiments of the present disclosure may implement storing the data written by the front door write operation into the memory unit 221 through the memory access interface 232.

For example, as shown in FIG. 1, if necessary the first portion 200 may also include a rate matching bridge 250, and the rate matching bridge 250 is configured to be connected to the second slave module 220 and the memory access interface 232 respectively. Embodiments of the present disclosure can perform read-write rate conversion and processing via the rate matching bridge 250, so that the problems of metastability of data transmission across clock domains and clock signal mismatch between the design under test 231 and the memory unit 221 can be avoided.

In some examples, the sources of data in the memory unit 221 of the second slave module 220 include two types. The first type is to write data into the register of the design under test 231 by the front door write operation and transfer it to the memory unit 221 of the second slave module 220 across the clock domain via the rate matching bridge 250. The second type is to import data into the memory unit 221 through a data loading operation of the back door.

In some examples, the memory unit 221 of the second slave module 220 has a virtual storage space. For example, the present disclosure may divide a portion of storage space to the memory unit 221 by a Palladium device. This is merely illustrative and not a limitation of the embodiments of the present disclosure.

For example, as shown in FIG. 2, the first direct programming interface 310 includes a direct programming interface (C/C++ DPI) based on C language or CPP language, and the second direct programming interface 320 includes a one-time access type direct programming interface (MARG DPI) based on C language or CPP language. For example, MARG DPI is a type of interface that is relatively well suited for one-time storage and reading.

The embodiment of the present disclosure is connected to the software side of the verification system and the hardware side of the verification system through the DPI interface, so that not only the first master module 210 can complete the front door access (such as a front door read and write operation) to the register such as the AMBA bus by a CPP interface function of the DPI, but also the memory unit 221 of the second slave module 220 can directly achieve the back door access to the memory unit 221 by calling a CPP interface function corresponding to the MARG DPI based on the set MARG DPI, so that data loading of the memory unit and data exporting of the memory unit can be achieved.

The CPP interface function (e.g. the first function or the second function described above, for example, the first function may include a function related to register reading and/or writing, and the second function includes a memory unit loading and/or exporting function, etc.) adopted by the embodiment of the present disclosure can be written and packaged by the CPP language, which is convenient to call, and can realize functions with more complex functions, functions more consistently with test cases required by the chip, and achieve synchronization between the software side and the hardware side, and the efficiency of simulation acceleration is greatly improved.

Figures 3, 4:
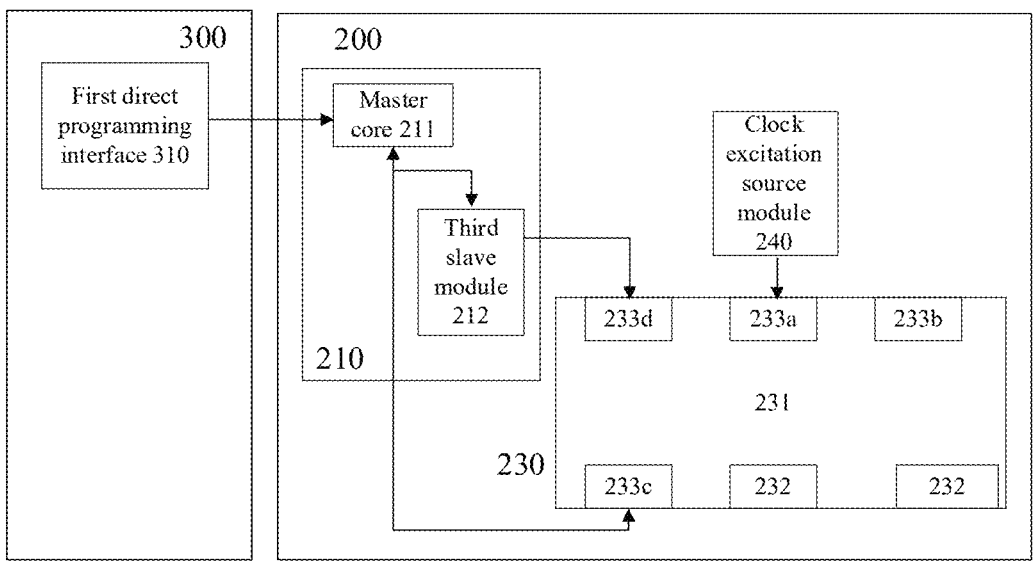
FIG. 3 is a schematic block diagram of a first master module of a verification system provided by some embodiments of the present disclosure.
FIG. 4 is a schematic diagram of address spaces of a first master module and a second slave module provided by some embodiments of the present disclosure.

FIG. 3 is a schematic block diagram of a first master module of a verification system provided by some embodiments of the present disclosure.

For example, as shown in FIG. 3, the first master module 210 includes a master core 211 and a third slave module 212. For example, the third slave module 212 is embedded in the first master module 210, and the third slave module 212 is an embedded advanced peripheral bus slave module, namely, an embedded APB module. It should be noted that the third slave module 212 of the embodiment of the present disclosure is referred to as a slave module with respect to the master core 211, and this is merely a way of naming and the embodiment of the present disclosure is not limited thereto, and the protection scope of the embodiment of the present disclosure is not limited thereto.

In some examples, the master core 211 of the first master module 210 is an AVIP core, and the master core 211 of the first master module 210 includes a synthesizable RTL code.

For example, as shown in FIG. 3, the master core 211 is connected to the first direct programming interface 310 and the third interface 233*c* respectively, so as to enable the master core 211 to acquire a register access instruction (that is, an instruction for performing a read operation or a write operation on the register of the design under test 231) corresponding to the first function of the test case, for configuring the register of the design under test 231.

For example, when a user runs the test case and calls the first function, the master core 211 of the first master module 210 may acquire the register access instruction for configuring the register of the design under test 231.

In some examples, the master core 211 also acquires control data associated with the register access instruction. The control data includes basic data required for performing a read operation or a write operation on the register, such as a base address of the memory and a base width of the memory, etc. This is merely exemplary and is not a limitation of the present disclosure.

For example, as shown in FIG. 3, the third slave module 212 of the first master module 210 is connected to the master core 211 and the fourth interface 233*d* respectively, so that a reset signal generated by the master core 211 can be transmitted to the fourth interface 233*d* for resetting the first portion 200. For example, a reset is required before each test case starts running for simulation, so that the state of all cores and the state of all memories inside the hardware side are the most initial states.

In some examples, when the second slave module 220 is an AMBA module, a plurality of different types of AMBA modules may be instantiated, such as an APB module, an AXI module or an ACE module. This is merely exemplary and is not a limitation of the present disclosure.

In some examples, when instantiating the second slave module 220, the AMBA parameter that needs to be declared includes at least one selected from the group consisting of the following: a memory size, a memory base address, and a depth of a currently outstanding operation that can be supported. This is merely exemplary and is not a limitation of the present disclosure.

In some examples, each of the first master module 210, the second slave module 220 and the third slave module 212 is configured with an independent storage space. For example, after the verification system 1000 is initially built, storage space needs to be allocated to each of various modules, such as the first master module 210, the second slave module 220 and the third slave module 212.

FIG. 4 is a schematic diagram of address spaces of a first master module and a second slave module provided by some embodiments of the present disclosure.

In some examples, an address offset of the first master module 210 is 0x0000_0000 and an address offset of the third slave module 212 is 0x0010_0000 (1 M Byte). For example, as shown in FIG. 4, an address range of the first master module 210 includes 0x0000_0000~0x000F_FFFF with a size of 1 MB and 0x0010_0000~0x001F_FFFF with a size of 1 MB. For example, as shown in FIG. 4, one second slave module 220 of the two second slave modules 220 has an address range of 0x4000_0000~0x7FFF_FFFF with a size of 1 GB, and the other second slave module 220 has an address range of 0x8000_0000~0xFFFF_FFFF with a size of 2 GB. This is merely exemplary and is not a limitation of the present disclosure.

In some examples, the second portion 300 further includes a configuration file. The test case is configured to perform case configuration for the front door access based on the at least one first function of the configuration file, or, the test case is configured to perform case configuration for the back door access based on the at least one second function of the configuration file.

In some examples, the function library module 330 includes a static library generated by compiling through the behavioral modeling language based on the test case and the configuration file.

For example, in the example of FIG. 2, the test cases provided by the test case module 340 include test0-test3, and different test cases may call different functions to verify the functions that meet the requirements. For example, as shown in FIG. 2, the test case module 340 may call a configuration file by using test_entry( ) to provide the relevant test cases. The test_entry( ) is an entry for the user to edit the test case under test, and the configuration file (e.g. cfg file) is called in test_entry( ) to complete the configuration of the relevant test case. The verification system 1000 can provide an API for a user to configure the front door access to the register and the back door access. For example, the configuration file is compiled through C/CPP to generate a static library ("user lib"), which is further parsed by an API interface to complete, for example, reading of the register and writing of the register.

The simulation accelerated verification of the above-described embodiments of the present disclosure uses test cases constructed based on C/CPP code, so that the environment is relatively simple, there is no complex methodology, the simulation environment can be built quickly, and the running speed is very fast.

In some examples, the first function includes: at least one selected from the group consisting of a register reading function reg_read, a register writing function reg_write, a register post-reading checking function reg_read_check, a register reading-after-writing and checking function reg_write_check, and a register polling wake-up reading function poll_reg_equal.

For example, the function reg_write is configured to directly implement writing 32 bit data at a specific register address, and the function reg_read is configured to directly implement reading 32 bit data at a specific register address.

For example, the function reg_read_check is configured to check whether the data written by a specific address register is the same as expected. For example, the data written by the specific address register may be the data written by the function reg_write.

For example, the function reg_read_check first reads data from a specific address register, then compares the read data with expected data. If a comparison result is that they are the same, the check is passed, and if the comparison result is that they are not the same, the current operation is stopped and an error is reported. Embodiments of the present disclosure provide for writing data into a register at a particular address through the function reg_read_check and automatically comparing the read result with the expected result, so that the degree of automation is relatively high, and the working efficiency of verifiers can be improved.

The function of the function reg_write_check and the method of the function reg_write_check may also refer to the function reg_read_check, with the difference that the function reg_write_check further includes writing data in the specific address register, which will not be described in detail herein.

For example, the function poll_reg_equal is configured to continuously poll and read a value of a specific address register for multiple times until the value read from the specific address register is equal to the expected value; if not equal, reading is continued until the quantity of times of reading exceeds a maximum quantity of times (for example, 10000) of polling set by the user, reporting an error and ending polling; if the value is read multiple times from the register at the same address but still different from the expected value, an error is reported and the reading cycle ends.

For example, the function poll_reg_equal may poll the relevant register to wake up and in turn check the reading and writing results of the register data in a case where part of the registers needs to be polled to wake up the registers before the second function makes the back door access to the memory unit of the second slave module.

In some examples, the second function includes: at least one selected from the group consisting of a memory unit polling wake-up reading function poll_mem_equal, a memory unit initialization function mem_init, a memory unit data loading function mem_load, and a memory unit data-exporting function.

In some examples, the memory unit data-exporting function includes a memory unit multi-byte reading function or a memory unit data grabbing function mem_dump, wherein lengths of data segment read by the function mem_dump and the memory unit multi-byte reading function are different, and the length of data segment read by the function mem_dump is greater than the length of the data segment read by the memory unit multi-byte reading function.

For example, the memory unit multi-byte reading function includes a function mem_read32 or a function mem_read64. The function mem_read32 is configured to directly implement reading 32 bit data at a specific memory unit address, and the function mem_read64 is configured to directly implement reading 64 bit data at a specific memory unit address.

For example, the function mem_dump may grab data from the memory unit and grab the data of the memory unit into a self-named hexadecimal format file (hex file) in hexadecimal format.

For example, the function mem_load is configured to load a readable file in hexadecimal format into the verification system. This hexadecimal format file is a two-dimensional array, which is preceded by an address and followed by data. The function mem_load loads each data into the corresponding storage space according to its address.

For example, the function poll_mem_equal is configured to continuously poll and read the value of the memory unit of a specific address for multiple times until the value read from the memory unit of the specific address is equal to an expected value; if the comparison result is that they are not equal, reading is continued until the quantity of times of reading exceeds a maximum quantity of times (for example, 10000) of polling set by the user, reporting an error and ending polling; if the value is read multiple times from the memory unit at the same address but still different from the expected value, an error is reported and the reading cycle ends.

For example, the function mem_init is configured to initialize the memory unit in a used address range to prevent the residual data of the memory unit after the last test case run from affecting running of the next test case and result comparison. The function mem_init initializes the memory unit with a set address range in five main modes:

Mode 0: all values of the memory unit are all initialized to 0x0000_0000;

Mode 1: all the values of the memory unit are all initialized to 0xFFFF_FFFF;

Mode 2: the value of the memory unit is initialized to a value of each memory unit address;

Mode 3: the value of the memory unit is initialized to a value with 0x4 increased each time starting from 0x0; and Mode 4: the value of the memory unit is initialized to a value with 1 increased each time starting from 0.

The above-mentioned modes and corresponding functions are merely exemplary and are not intended to limit embodiments of the present disclosure.

In some examples, the function library module 330 may also include a file comparison function file_cmp and/or a reset function glb_rst.

For example, the function file_cmp may compare two hex files to obtain a comparison result. In the test case of an embodiment of the present disclosure, a user may specify the names of two hex files that need to be compared on his own in definition of the function file_cmp.

For example, the function glb_rst may be configured to reset the first portion 200, and reset the state of the modules in the first portion 200.

In some examples, each test case of the plurality of test cases provided by the test case module 340 may not be identical with each other, the corresponding function(s) of each test case may be one or more. For example, each test case may be any one of the functions or any combination of the functions described above, and the embodiments of the present disclosure are not limited in this respect, and may be freely adjusted according to actual verification requirements, which will not be described in unnecessary detail herein.

It should be noted that the functions included in the function library module 330 of the embodiments of the present disclosure are not limited to the above-mentioned examples, but may be other corresponding functions for satisfying verification requirements, and are not exhaustive or redundantly described herein.

At least one embodiment of the present disclosure also provides a verification method that can be implemented based on the verification system described in any of the embodiments described above. With regard to specific embodiments and technical effects of the verification method based on the verification system, reference can be made to the verification system provided in the above-mentioned embodiments of the present disclosure.

FIG. 5 is a flowchart of a verification method provided by some embodiments of the present disclosure.

With reference to FIG. 5, for example, at least one embodiment of the present disclosure provides a verification method including step S1 to step S5.

Step S1: performing RTL code compilation based on the design under test 231.

Step S2: performing comprehensive compilation based on the first portion 200, the object under test 230, the design under test 231, the first master module 210 and the second slave module 220 to acquire a compiled first portion 200.

Step S3: selecting a usage mode of the simulation verification device 100, adding at least one compilation option to the compiled first portion 200 according to the usage mode, and calling a first assembler to deconstruct the verification system 1000 to generate a hardware information library for the simulation verification device 100, so as to implement accelerator compilation.

Step S4: performing code compilation of a behavioral modeling language for the second portion 300.

Step S5: running the compiled first portion 200 and the compiled second portion 300 to acquire a verification result.

In some examples, the verification method of the present disclosure further includes the following process or step: debugging according to the verification result, so as to enable the verification to pass.

In some examples, the verification method of the present disclosure further includes the following process or step: configuring the verification result to be visualized on the simulation verification device 100, wherein the visualization methods include but not limited to, a chart, a text, a waveform, etc. In this way, the verification result can be reflected timely, conveniently and accurately, which is beneficial to the management and execution of verification.

For example, in step S1, the performing RTL code compilation based on the design under test 231 includes the following process or step: using a second assembler to compile a RTL file list of the design under test 231 and a corresponding RTL file, and generating a DUT netlist containing the set format of the object under test 230, for example, generating a DUT netlist containing a vg format of the object under test 230. The generated DUT netlist is configured to run on the simulation verification device 100. It should be noted that the set format of the DUT netlist of the embodiment of the present disclosure is not limited to the vg format, but may be other types of formats, such as the edif format, etc., and the embodiments of the present disclosure are not limited thereto.

For example, in step S1, the second compilation tool includes Cadence's compilation tool vavlog or compilation tool vaelab. This is, of course, merely exemplary and is not a limitation of the present disclosure.

For example, in step S2, the performing comprehensive compilation based on the first portion 200, the object under test 230, the design under test 231, the first master module 210 and the second slave module 220 to acquire a compiled first portion 200 includes the following process or step: performing comprehensive compilation for the first portion 200, the object under test 230, the design under test 231, the first master module 210, the second slave module 220 (for example, two second slave modules 220 in FIG. 1) and the clock excitation source module 240 based on the a third assembler of the simulation verification device 100 to acquire a compiled hardware side.

For example, the third assembler includes the Palladium-based vlan tool of Cadence. This is, of course, merely exemplary and is not a limitation of the present disclosure.

For example, in step S2, objects of the comprehensive compilation of the embodiment of the present disclosure include not only the first portion 200, the object under test 230, the design under test 231, the first master module 210 and the second slave module 220, but also, for example, performing comprehensive compilation on necessary Cadence A VIP files and other required peripheral test resources. Since this is not the focus of the description of the embodiment of the present disclosure, it is not exhaustive and redundant here. Thus, a compiled hardware side can be generated by the comprehensive compilation of this step.

For example, in step S3, the selecting a usage mode of the simulation verification device 100, adding at least one compilation option to the compiled first portion 200 according to the usage mode, and calling a first assembler to deconstruct the verification system to generate a hardware information library for the simulation verification device includes the following process or step: selecting an IXCOM mode of the Palladium device, adding the at least one compilation option to the compiled first portion 200 according to the IXCOM mode, and calling the first assembler to deconstruct the verification system 1000 to generate the hardware information library (hardware lib). For example, the hardware information library includes a lib base of information such as RTL, simulation environment, compilation environment, etc. This is merely exemplary and is not a limitation of the present disclosure.

The embodiments of the present disclosure select the IXCOM mode of Palladium, which makes it more compatible for the part of the design that is not comprehensive, supports putting part of the design into the simulation verification device, and it is also compatible with other modes, which can reduce the verification workload, reduce the cost and improve the verification efficiency.

For example, in step S3, by means of a IXCOM compilation tool based on Cadence, the compiled first portion 200 generated by comprehensive compilation is compiled by adding compilation options such as -z1, -ua+1xua, -dpi, -timescale, and the first assembler such as vxe of Cadence can also be called to perform a process such as deconstruction (for example, programming and assembling a natural language into a machine language) on the whole of the verification system 1000, so as to generate a hardware information library which can be directly used for the simulation verification device 100, thereby completing accelerator compilation. This is merely exemplary and is not a limitation of the present disclosure.

For example, in step S4, the behavioral modeling language may be the CPP language, that is, step S4 is used for CPP code compilation of the second portion 300.

For example, the CPP code of the test case set by the user is mainly compiled in step S4, which may, for example, include: setting a type of the first function and/or the second function specifically called, how to collocate the first function and/or the second function called, specific settings of the first function and/or the second function (for example, a register reading and writing address and specifically written data), and a first reference file used for comparison (see below for details), etc. Thus, the verification system calls the file of the static library generated by this step S4 at a final run time, so that the test case set by the user can take effect in the simulation accelerated verification process and complete the test function.

In some examples, the verification method of the present disclosure further includes the following process or step: checking whether the register configuring the module under test as described above meets the target requirement of the design under test 231.

For example, for different designs under test 231, the test case module 340 of the embodiments of the present disclosure provides different test cases, and the same design under test 231 may also develop a plurality of different test cases based on a plurality of different verification requirements, and different test cases may correspond to different function settings, register settings, expected data results, etc., so that different data will be written to the registers for AMBA bus.

In some examples, for the first portion 200 and the second portion 300 created on the simulation verification device 100 in the embodiments of the present disclosure, which represent a verification environment built on the basis of the simulation verification device 100, the verification environment is divided into a hardware side and a software side, and the hardware side and the software side can interact with each other. For example, it may be that the first portion 200 is transplanted on the simulation verification device 100, such as, a Palladium device, and that the first portion is located on another device, such as, a server, which can realize communication connection with the hardware side connection. Of course, it is also possible that the first portion 200 and the second portion 300 run together on the Palladium device, and the embodiment of the present disclosure does not limit this.

FIG. 6 is a flowchart of an execution process of step S5 of the verification method in FIG. 5. For example, as shown in FIG. 6, one example of step S5 includes at least step S51 to step S53.

Step S51: in response to the design under test 231 being a first module, reading first data of the memory unit 221 through the back door access to acquire a first reference file.

Step S52: in response to the design under test 231 being a second module, reading second data of the memory unit 221 through the back door access to acquire a second file.

Step S53: comparing the second file with the first reference file to acquire the verification result.

For example, in step S51, the reading first data of the memory unit 221 through the back door access to acquire a first reference file includes the following process or step: in response to an end of running of the test case (for example, after the end of the first running of the test case), reading the first data of the memory unit 221 through the back door access to obtain a self-named first target hexadecimal format file; and generating a standard version of a second target hexadecimal format file based on the first target hexadecimal format file to acquire the first reference file.

For example, the first target hexadecimal format file is referred to as a first hex file, and the second target hexadecimal format file is referred to as a golden version of a second hex file. This is merely exemplary and is not a limitation of the present disclosure.

For example, in step S52, the second module is configured as a module that is updated based on the first module. The second module is a design under test that is iteratively updated based on the first module in a process of chip development. Therefore, each time a change in RTL code occurs for an iterative update of the design under test 231, the test case needs to be rerun to test for a change in RTL functionality and to calibrate the RTL by using the first reference file.

For example, in step S52, the reading second data of the memory unit 222 through the back door access to acquire a second file includes the following process or step: running the test case again, and reading the second data of the memory unit 221 through the back door access to acquire the second file. For example, the test case in this step S52 is theoretically expected to be the same as the first-run test case in the above-mentioned step S51, so that it can be determined whether the verification is passed.

For example, in step S53, the comparing the second file with the first reference file to acquire the verification result includes the following process or step: if the comparison result between the second file and the first reference file is that they are the same, the verification is passed, for example, "testcase pass" characters or patterns can be printed to a graphical interface, and the flow ends; if the comparison result between the second file and the first reference file is that they are different, the verification fails, for example, "testcase fail" characters or patterns can be printed to the graphical interface, the test case can be debugged, and the RTL code of the design under test 231 can also be checked. Thus, after modification and debugging, rerunning is performed, the process of comparison is repeated until the obtained comparison result is that the second file and the first reference file are the same, the verification is passed, and the flow ends.

Thus, when the verification fails, in step S52, the reading second data of the memory unit 222 through the back door access to acquire a second file further includes the following process or step: debugging the test case, running the test case after debugging, and reading the second data of the memory unit 221 through the back door access to acquire the second file. For example, the test case after debugging in step S52 is a test case subject to the same test case configuration with respect to the test case initially run in step S51, so that the problem of verification failure due to the error of test cases in the actual process can be avoided, thereby enabling the simulation verification process to be smoothly performed.

In some examples, before running the test case again, the test case may also be debugged, which is not limited by embodiments of the present disclosure.

In some examples, when running the compiled first portion 200 and the compiled second portion 300, the graphical interface of the Palladium device may be started directly by executing an already packaged instruction Make emu_run in Makefile, so that a running result of the test case and the corresponding necessary log information are printed on the graphical interface for the user to perform further debugging and result recording.

The verification file and the basic verification process of the embodiments of the present disclosure have versatility, which helps to reduce the workload of verification. With the deepening of verification work, the quantity of test cases is increasing, the complexity of test cases is also increasing, and the designs are continually iterated. Through the work of automatic regression test, it is helpful to ensure the project quality and reduce the workload of tedious tasks.

Figure 7:
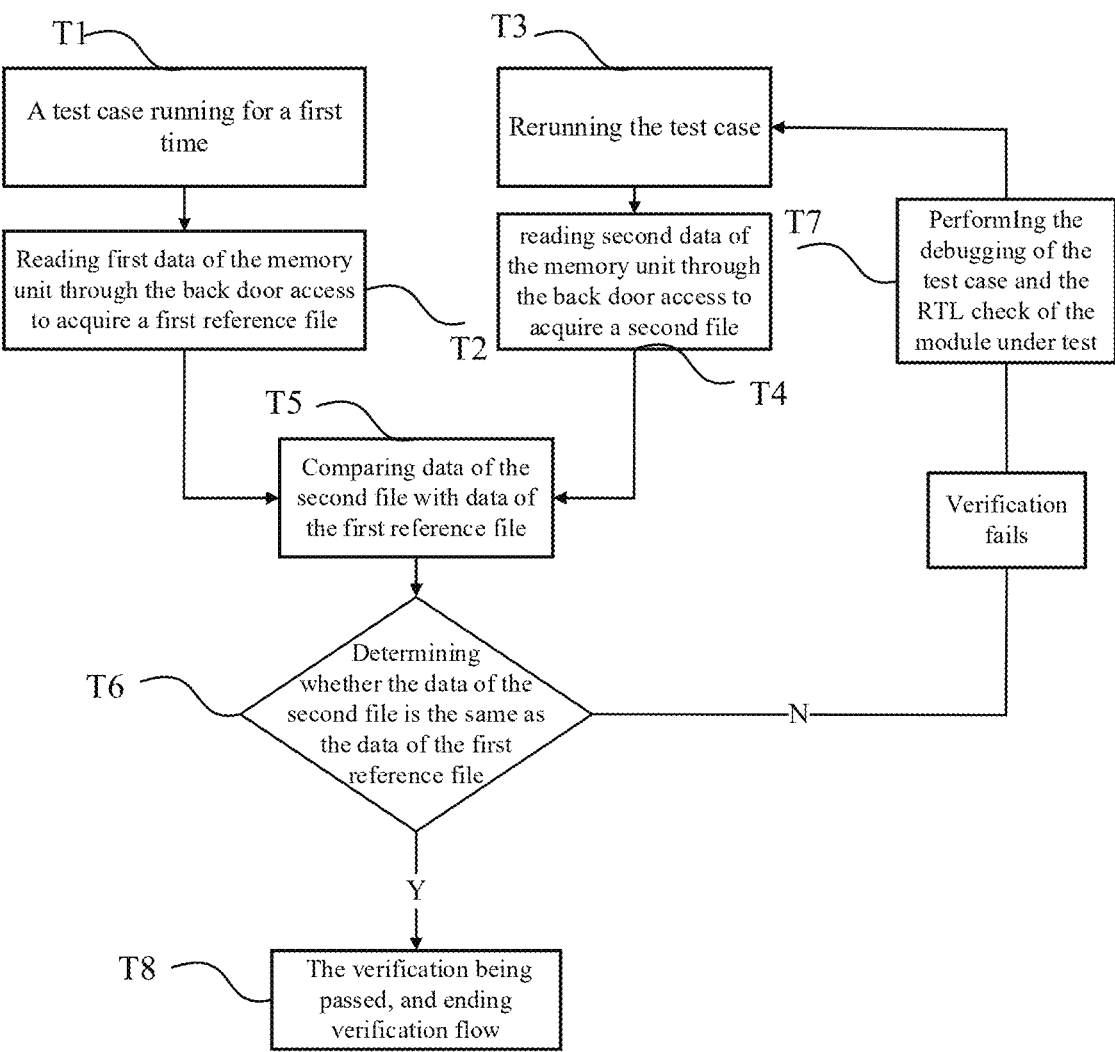
FIG. 7 is a flowchart of a verification method provided by some other embodiments of the present disclosure.

FIG. 7 is a flowchart of a verification method provided by some other embodiments of the present disclosure.

With reference to FIG. 7, for example, some embodiments of the present disclosure provide a verification method including step T1 to step T8.

Step T1: a test case running for a first time.

Step T2: reading first data of the memory unit through the back door access to acquire a first reference file.

Step T3: rerunning the test case.

Step T4: reading second data of the memory unit through the back door access to acquire a second file.

Step T5: comparing data of the second file with data of the first reference file.

Step T6: determining whether the data of the second file is the same as the data of the first reference file; if yes, it turns to step T8; if no, the verification fails, and the debugging of the test case in step T7 and the RTL check of the module under test in step T7 are performed, and steps T3 to T6 are performed in a loop until the determination result is that the data of the second file is the same as the data of the first reference file, and then it turns to step T8.

Step T8: the verification being passed, and ending verification flow.

For example, the first reference file in step T2 is the second hex file of the golden version.

For example, the test case in step T3 may be a test case after being debugged if the verification fails, or may be a test case obtained by debugging the test case before starting step T3, which is not limited by the embodiments of the present disclosure.

Based on the above-mentioned test case verification flow, the embodiments of the present disclosure can achieve an automatic flow with a certain universality, thereby achieving a simple and efficient hardware accelerated test method and flow with strong reusability, which greatly saves the time of chip verification engineering and greatly improves the chip verification efficiency.

Figure 8:
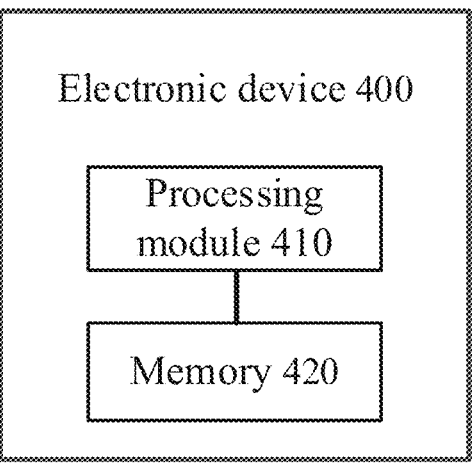
FIG. 8 is a schematic block diagram of an electronic device provided by some embodiments of the present disclosure.

FIG. 8 is a schematic block diagram of an electronic device provided by some embodiments of the present disclosure. The electronic device 400 includes a processing module 410 and a memory 420, wherein a computer program is stored in the memory 420, and when the computer program is executed by the processing module 410, the verification methods of at least some embodiments of the present disclosure are implemented.

The electronic device in the embodiment of the present disclosure may include but not be limited to a mobile terminal such as a notebook computer and a tablet computer, and a fixed terminal such as a desktop computer, a conventional server and a cloud server. The electronic device shown in FIG. 8 is only an example and should not impose any limitations on the functions and use scopes of the embodiments of the present disclosure.

Particularly, according to some embodiments of the present disclosure, the processes described above with reference to the flowcharts may be implemented as a computer software program. For example, some embodiments of the present disclosure include a computer program product, which includes a computer program carried by a non-transitory computer-readable medium. The computer program includes program codes for performing the methods shown in the flowcharts. When the computer program is executed by the processing module, the verification method of some embodiments of the present disclosure are performed.

It should be noted that the above-mentioned computer-readable medium in the present disclosure may be a computer-readable signal medium or a computer-readable storage medium or any combination thereof. For example, the computer-readable storage medium may be, but not limited to, an electric, magnetic, optical, electromagnetic, infrared, or semiconductor system, apparatus or device, or any combination thereof. More specific examples of the computer-readable storage medium may include but not be limited to: an electrical connection with one or more wires, a portable computer disk, a hard disk, a random-access memory (RAM), a read-only memory (ROM), an erasable programmable read-only memory (EPROM or flash memory), an optical fiber, a compact disk read-only memory (CD-ROM), an optical storage device, a magnetic storage device, or any appropriate combination of them. In the embodiments of the present disclosure, the computer-readable storage medium may be any tangible medium containing or storing a program that can be used by or in combination with an instruction execution system, apparatus or device. In the embodiments of the present disclosure, the computer-readable signal medium may include a data signal that propagates in a baseband or as a part of a carrier and carries computer-readable program codes. The data signal propagating in such a manner may take a plurality of forms, including but not limited to an electromagnetic signal, an optical signal, or any appropriate combination thereof. The computer-readable signal medium may also be any other computer-readable medium than the computer-readable storage medium. The computer-readable signal medium may send, propagate or transmit a program used by or in combination with an instruction execution system, apparatus or device. The program code contained on the computer-readable medium may be transmitted by using any suitable medium, including but not limited to an electric wire, a fiber-optic cable, radio frequency (RF) and the like, or any appropriate combination of them.

The above-mentioned computer-readable medium may be included in the above-mentioned electronic device, or may also exist alone without being assembled into the electronic device.

It should be noted that, in the embodiment of the present disclosure, the specific functions and technical effects of the electronic device 400 can refer to the above description of the verification method, and will not be repeated here.

The following points need to be clarified:

(1) The drawings of the embodiments of the present disclosure only refer to the structures to which the embodiments of the present disclosure relate, and other structures may refer to general designs.

(2) In case of no conflict, the embodiments of the present disclosure and the features in the embodiments may be combined with each other to obtain new embodiment(s).

The above description is only about specific implementations of the present disclosure, but the scope of protection of the present disclosure is not limited thereto. The scope of protection of the present disclosure should be subject to the scope of protection of the appended claims.

The invention claimed is:

1. A verification system, comprising a simulation verification device, and a first portion and a second portion which are created on the simulation verification device respectively, wherein the first portion comprises a first master module and at least one second slave module which are connected to an object under test respectively;

the object under test comprises a design under test and a plurality of object interfaces connected to a periphery of the design under test, the plurality of object interfaces comprise a memory access interface, the second slave module comprises a memory unit, and the memory unit is connected to the memory access interface;

the second portion comprises a first direct programming interface, a second direct programming interface, a function library module and a test case module, and the test case module is configured to provide at least one test case;

the first direct programming interface communicates with the first master module, and the first direct programming interface is configured to: in response to running the test case, call at least one first function in the function library module to implement front door access to a register of the design under test; and the second direct programming interface communicates with the memory unit of the first portion, and the second direct programming interface is configured to: in response to running the test case, call at least one second function in the function library module to implement back door access to the memory unit.

2. The verification system according to claim 1, wherein the first portion is a hardware side, and the hardware side is configured to be created based on a hardware description language; and the second portion is a software side, and the software side is configured to be created based on a behavioral modeling language.

3. The verification system according to claim 1, wherein the simulation verification device comprises a first processor and the first processor comprises a plurality of second processors connected in parallel.

4. The verification system according to claim 3, wherein the simulation verification device comprises a Palladium device, the first direct programming interface comprises a direct programming interface based on C language or CPP language, and the second direct programming interface comprises a one-time access type direct programming interface based on C language or CPP language.

5. The verification system according to claim 1, wherein the first portion further comprises a clock excitation source module for providing a clock signal, and the plurality of object interfaces further comprise at least one selected from the group consisting of a first interface, a second interface, a third interface and a fourth interface;

the first interface is connected to the clock excitation source module to receive the clock signal;

the second interface is configured to receive an interrupt request signal;

the first master module is connected to the third interface for configuring the register of the design under test; and the first master module is connected to the fourth interface for resetting the first portion.

6. The verification system according to claim 5, wherein the first master module comprises a master module with an advanced microcontroller bus architecture, and the second slave module comprises a slave module with an advanced microcontroller bus architecture;

the first master module comprises a master core and a third slave module, and the master core is connected to the first direct programming interface and the third interface respectively, so as to enable the master core to acquire a register access instruction corresponding to the first function of the test case for configuring the register of the design under test; and the third slave module is connected to the master core and the fourth interface respectively, and transmits a reset signal generated by the master core to the fourth interface for resetting the first portion.

7. The verification system according to claim 1, wherein the first portion further comprises a rate matching bridge, wherein the rate matching bridge is connected to the second slave module and the memory access interface respectively.

8. The verification system according to claim 2, wherein the second portion further comprises a configuration file, the test case is configured to perform case configuration for the front door access based on the at least one first function of the configuration file, or, the test case is configured to perform case configuration for the back door access based on the at least one second function of the configuration file; and the function library module comprises a static library generated by compiling through the behavioral modeling language based on the test case and the configuration file.

9. The verification system according to claim 1, wherein the at least one first function comprises at least one selected from the group consisting of a register reading function, a register writing function, a register post-reading checking function, a register reading-after-writing and checking function, and a register polling wake-up reading function; and the at least one second function comprises at least one selected from the group consisting of a memory unit polling wake-up reading function, a memory unit initialization function, a memory unit data loading function, and a memory unit data-exporting function.

10. The verification system according to claim 6, wherein each of the first master module, the second slave module and the third slave module is configured with an independent storage space.

11. A verification method based on a verification system, comprising:

performing register transfer level code compilation based on a design under test, wherein the verification system comprises a simulation verification device, and a first portion and a second portion which are created on the simulation verification device respectively, the first portion comprises a first master module and at least one second slave module which are connected to an object under test respectively; the object under test comprises the design under test and a plurality of object interfaces connected to a periphery of the design under test, the plurality of object interfaces comprise a memory access interface, the second slave module comprises a memory unit, and the memory unit is connected to the memory access interface; the second portion comprises a first direct programming interface, a second direct programming interface, a function library module and a test case module, and the test case module is configured to provide at least one test case; the first direct programming interface communicates with the first master module, and the first direct programming interface is configured to: in response to running the test case, call at least one first function in the function library module to implement front door access to a register of the design under test; and the second direct programming interface communicates with the memory unit of the first portion, and the second direct programming interface is configured to: in response to running the test case, call at least one second function in the function library module to implement back door access to the memory unit;

performing comprehensive compilation based on the first portion, the object under test, the design under test, the first master module and the second slave module to acquire a compiled first portion;

selecting a usage mode of the simulation verification device, adding at least one compilation option to the compiled first portion according to the usage mode, and calling a first assembler to deconstruct the verification system to generate a hardware information library for the simulation verification device, so as to implement accelerator compilation;

performing code compilation of a behavioral modeling language for the second portion; and running the compiled first portion and the compiled second portion to acquire a verification result.

12. The verification method according to claim 11, wherein the simulation verification device includes a Palladium device; and the first portion is a hardware side, and the hardware side is configured to be created based on a hardware description language; and the second portion is a software side and the software side is configured to be created based on a behavioral modeling language.

13. The verification method according to claim 11, wherein the performing register transfer level code compilation based on the design under test, comprises:

using a second assembler to compile a register transfer level file list of the design under test and a corresponding register transfer level file, and generating a design-under-test netlist containing a set format of the object under test, wherein the design-under-test netlist generated is configured to run on the simulation verification device.

14. The verification method according to claim 12, wherein, in response to the first portion further comprising a clock excitation source module for providing a clock signal, the performing comprehensive compilation based on the first portion, the object under test, the design under test, the first master module and the second slave module to acquire a compiled first portion, comprises:

performing comprehensive compilation for the first portion, the object under test, the design under test, the first master module, the second slave module and the clock excitation source module based on a third assembler of the simulation verification device to acquire a compiled hardware side.

15. The verification method according to claim 12, wherein the selecting a usage mode of the simulation verification device, adding at least one compilation option to the compiled first portion according to the usage mode, and calling a first assembler to deconstruct the verification system to generate a hardware information library for the simulation verification device, comprises:

selecting an IXCOM mode of the Palladium device, adding the at least one compilation option to the compiled first portion according to the IXCOM mode, and calling the first assembler to deconstruct the verification system to generate the hardware information library.

16. The verification method according to claim 11, wherein the running the compiled first portion and the compiled second portion to acquire a verification result, comprises:

in response to the design under test being a first module, reading first data of the memory unit through the back door access to acquire a first reference file;

in response to the design under test being a second module, reading second data of the memory unit through the back door access to acquire a second file, wherein the second module is configured as a module for updating based on the first module; and comparing the second file with the first reference file to acquire the verification result.

17. The verification method according to claim 16, wherein the reading first data of the memory unit through the back door access to acquire a first reference file, comprises:

in response to an end of running of the test case, reading the first data of the memory unit through the back door access to obtain a self-named first target hexadecimal format file; and generating a standard version of a second target hexadecimal format file based on the first target hexadecimal format file to acquire the first reference file.

18. The verification method according to claim 16, wherein the reading second data of the memory unit through the back door access to acquire a second file, comprises:

debugging the test case, running the test case after debugging, and reading the second data of the memory unit through the back door access to acquire the second file.

19. An electronic device, comprising:

a processor and a memory, wherein a computer program is stored on the memory, and when the computer program is executed by the processor, a verification method based on a verification system is implemented and the verification method comprises:

performing register transfer level code compilation based on a design under test, wherein the verification system comprises a simulation verification device, and a first portion and a second portion which are created on the simulation verification device respectively, the first portion comprises a first master module and at least one second slave module which are connected to an object under test respectively; the object under test comprises the design under test and a plurality of object interfaces connected to a periphery of the design under test, the plurality of object interfaces comprise a memory access interface, the second slave module comprises a memory unit, and the memory unit is connected to the memory access interface; the second portion comprises a first direct programming interface, a second direct programming interface, a function library module and a test case module, and the test case module is configured to provide at least one test case; the first direct programming interface communicates with the first master module, and the first direct programming interface is configured to: in response to running the test case, call at least one first function in the function library module to implement front door access to a register of the design under test; and the second direct programming interface communicates with the memory unit of the first portion, and the second direct programming interface is configured to: in response to running the test case, call at least one second function in the function library module to implement back door access to the memory unit;

performing comprehensive compilation based on the first portion, the object under test, the design under test, the first master module and the second slave module to acquire a compiled first portion;

selecting a usage mode of the simulation verification device, adding at least one compilation option to the compiled first portion according to the usage mode, and calling a first assembler to deconstruct the verification system to generate a hardware information library for the simulation verification device, so as to implement accelerator compilation;

performing code compilation of a behavioral modeling language for the second portion; and running the compiled first portion and the compiled second portion to acquire a verification result.

20. A non-transitory computer-readable storage medium, storing a computer program, wherein the computer program, when executed by a processing module, implements the verification method according to claim 11.

* * * * *